(12) United States Patent
Mehnert et al.

(10) Patent No.: US 11,171,273 B2
(45) Date of Patent: Nov. 9, 2021

(54) LED PACKAGE WITH INTEGRATED FEATURES FOR GAS OR LIQUID COOLING

(71) Applicant: Lumileds LLC, San Jose, CA (US)

(72) Inventors: Axel Mehnert, San Jose, CA (US);
Dusan Golubovic, San Jose, CA (US);
Marcus Franciscus Donker, San Jose, CA (US); Hendrik Jan Eggink, San Jose, CA (US); Rene Van Honschooten, San Jose, CA (US); Theodoor Cornelis Treurniet, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 63 days.

(21) Appl. No.: 16/458,991

(22) Filed: Jul. 1, 2019

(65) Prior Publication Data

US 2020/0119246 A1    Apr. 16, 2020

Related U.S. Application Data

(63) Continuation of application No. 15/538,048, filed as application No. PCT/US2015/067973 on Dec. 30, 2015, now Pat. No. 10,340,432.

(Continued)

(51) Int. Cl.
*H01L 33/64* (2010.01)
*H01L 23/00* (2006.01)
(Continued)

(52) U.S. Cl.
CPC ............ *H01L 33/642* (2013.01); *H01L 24/97* (2013.01); *H01L 33/641* (2013.01);
(Continued)

(58) Field of Classification Search
CPC ....... H01L 33/52; H01L 33/64; H01L 33/641; H01L 33/642; H01L 33/647; H01L 24/97;
(Continued)

(56) References Cited

U.S. PATENT DOCUMENTS 8,878,217 B2    11/2014   Hussell
9,722,157 B2    8/2017    Kobayakawa et al.
(Continued)

FOREIGN PATENT DOCUMENTS

JP    2007-0096236    4/2007
KR    20130017461     2/2013
(Continued)

OTHER PUBLICATIONS

EPO as ISA, "International Search Report and Written Opinion" dated Jun. 28, 2016 from International Application No. PCT/US2015/067973, filed Dec. 30, 2015, 17 pages.

(Continued)

*Primary Examiner* — Monica D Harrison (57) ABSTRACT

A device is provided that comprises a metallic substrate defining a plurality of openings, the openings having a first area. The openings form one or more heat dissipating elements having a second area. The device comprises a plurality of sites on a surface of the one or more heat dissipating elements. Each site is configured to receive a light emitting element. The device comprises a plurality of conductor elements having a third area. The conductor elements are physically separated from the one or more heat dissipating elements by the openings. The conductor elements are configured to enable electrical connections to the light emitting elements and are electrically isolated from the one or more heat dissipating elements.

20 Claims, 8 Drawing Sheets

Related U.S. Application Data (60) Provisional application No. 62/097,623, filed on Dec. 30, 2014.

(51) Int. Cl.
*H01L 25/075* (2006.01)
*H01L 33/52* (2010.01)

(52) U.S. Cl.
CPC ........ *H01L 33/647* (2013.01); *H01L 25/0753* (2013.01); *H01L 33/52* (2013.01); *H01L 2224/48091* (2013.01); *H01L 2224/48247* (2013.01); *H01L 2924/0002* (2013.01); *H01L 2924/181* (2013.01)

(58) Field of Classification Search
CPC ............. H01L 2924/00; H01L 2924/00; H01L 2924/0002; H01L 2924/18; H01L 2924/181; H01L 2224/48091; H01L 2224/48247; H01L 25/07; H01L 25/075; H01L 25/0753
USPC ........................................................ 257/712
See application file for complete search history.

(56) References Cited

U.S. PATENT DOCUMENTS

| | | |
|---|---|---|
| 2004/0180459 A1 | 9/2004 | Hsu |
| 2010/0059785 A1* | 3/2010 | Lin ..................... H01L 23/3121 |
| | | 257/99 |
| 2011/0156083 A1 | 6/2011 | Wang et al. |
| 2011/0303941 A1 | 12/2011 | Lee |

FOREIGN PATENT DOCUMENTS

| | | |
|---|---|---|
| TW | 201212296 A | 3/2012 |
| TW | 201222900 A | 6/2012 |
| TW | 201406534 | 2/2014 |
| WO | 2005/101489 | 10/2005 |
| WO | 2009/141960 | 11/2009 |
| WO | 2014/016734 | 1/2014 |
| WO | 2014/017300 A1 | 1/2014 |

OTHER PUBLICATIONS

English Translation of the Intellectual Property Office, TW104144525, Office Action dated Jul. 2, 2019, 6 pages.

* cited by examiner

LED PACKAGE WITH INTEGRATED FEATURES FOR GAS OR LIQUID COOLING

CROSS-REFERENCE TO RELATED APPLICATIONS

This application is a continuation of U.S. application Ser. No. 15/538,048, filed on Jun. 20, 2017, which is the U.S. National Stage, under 35 U.S.C.§ 371, of International Application No. PCT/US2015/067973, filed Dec. 30, 2015, which claims the benefit of U.S. Provisional Application No. 62/097,623, filed Dec. 30, 2014, the contents are hereby incorporated by reference herein.

FIELD OF THE INVENTION

This invention relates to the field of light emitting devices, and in particular to a leadframe architecture that provides an integral heat dissipation surface for cooling the light emitting elements within the light emitting device.

BACKGROUND OF THE INVENTION

Leadframes are commonly used in the mass production of light emitting devices (LEDs) The leadframe may be a sheet or strip of metal that is etched or punched to provide a pattern of conductors for coupling to a light emitting element and providing pads or other elements that facilitate the use of the light emitting device in products or assemblies.

Figure 1A:
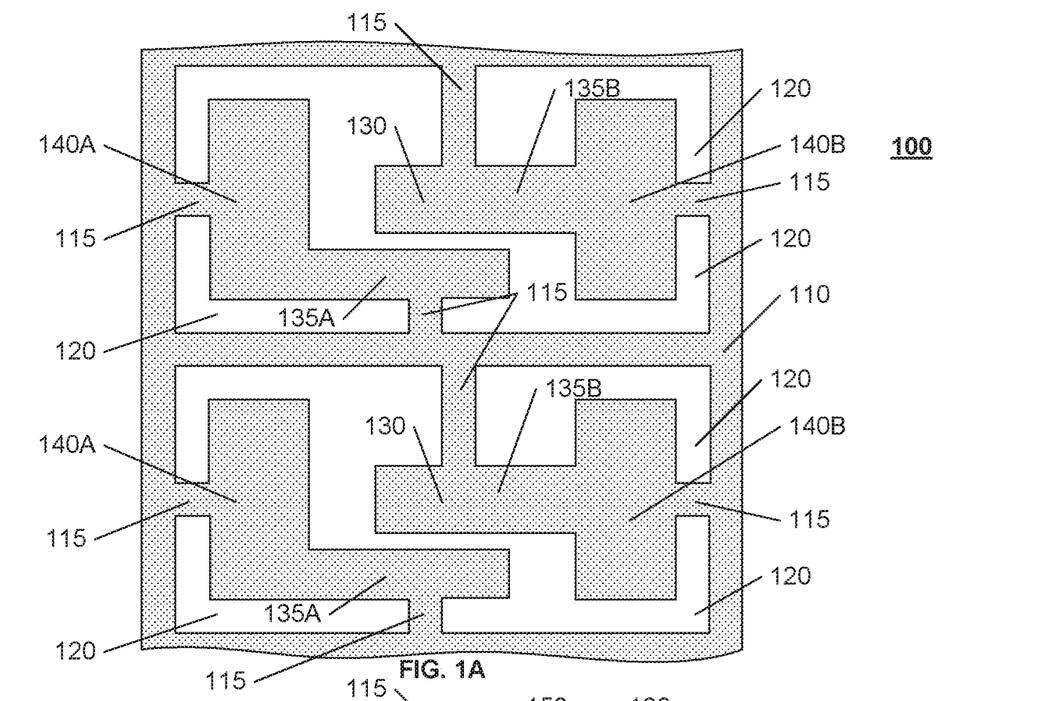
FIGS. 1A-1E illustrate an example manufacture of light emitting devices using a conventional lead frame design.

FIG. 1A illustrates a section of a conventional leadframe 100. The leadframe 100 includes openings 120 that form a pattern 110 of conductive elements. The leadframe 100 may extend for several feet, to provide patterns for situating each of a plurality of light emitting elements. The leadframe 100 travels in an assembly-line, wherein the various processes, detailed below, are performed to create individual light emitting devices.

The section illustrated in FIG. 1A includes conductive patterns for creating two light emitting devices. Although illustrated as a narrow strip with one column of patterns, a wider sheet may be used to provide an array of patterns. Each pattern includes a site 130 for situating the light emitting element, and pads 140A, 140B that facilitate mounting the finished light emitting device on a printed circuit board, or other assembly. The pattern 110 also includes conductive segments 135A, 135B (collectively "135") that serve to facilitate coupling these pads 140A, 140B to the light emitting element.

To operate properly, the pads 140A, 140B must not be connected to each other; however, to hold these pads 140A, 140B (and other elements) to the leadframe, a plurality of tiebars 115 are used to maintain mechanical integrity of the pattern during processing by connecting pads 140A, 140B to the leadframe 100. Typically, tie bars are severed in later stage of processing.

Figure 1B:
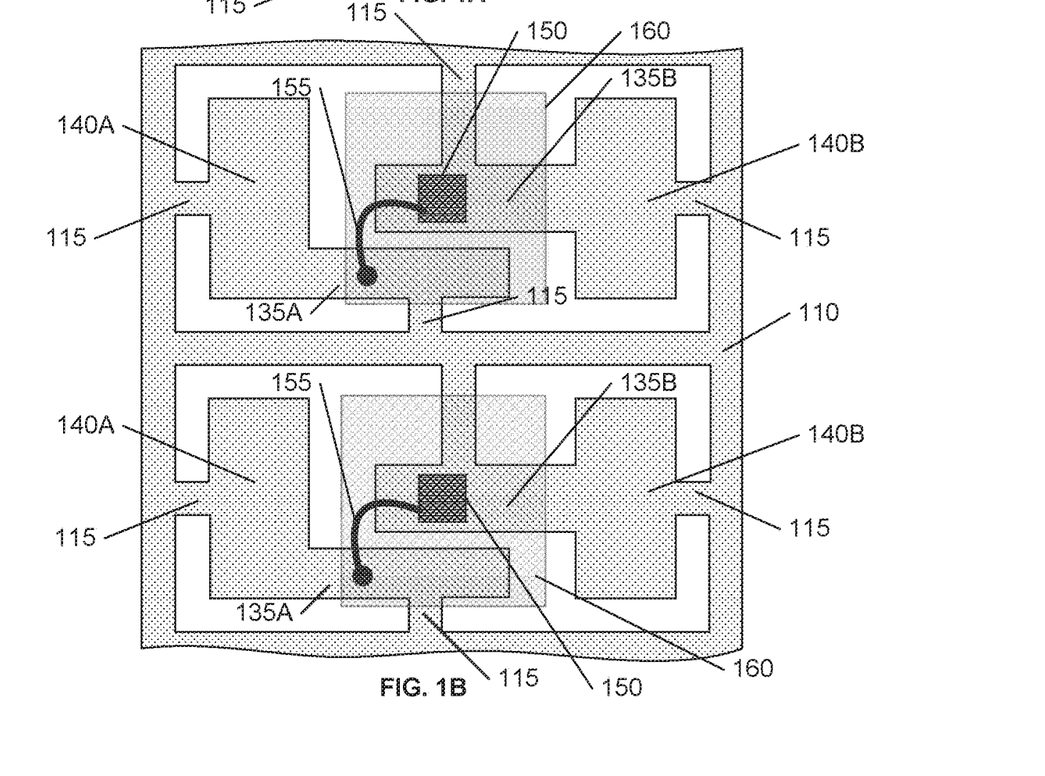

FIG. 1B illustrates the leadframe 100 after being 'populated' with light emitting elements 150 and protective structure 160. A light emitting element 150 is situated at the appropriate site (130 in FIG. 1A) on the pattern 110, and coupled to the conductive elements 135A, 135B. In this example, one of the contacts of the light emitting element 150 is situated on the lower surface of the light emitting element 150, and the other on the upper surface. Mounting/bonding the light emitting element 150 upon the conductor segment 135B effects a coupling of the contact on the lower surface of the light emitting element 150 to the pad 140B, and a bondwire 155 is used to couple the contact on the upper surface of the light emitting element 150 to the pad 140A, via conductor segment 135A.

Figure 1C:
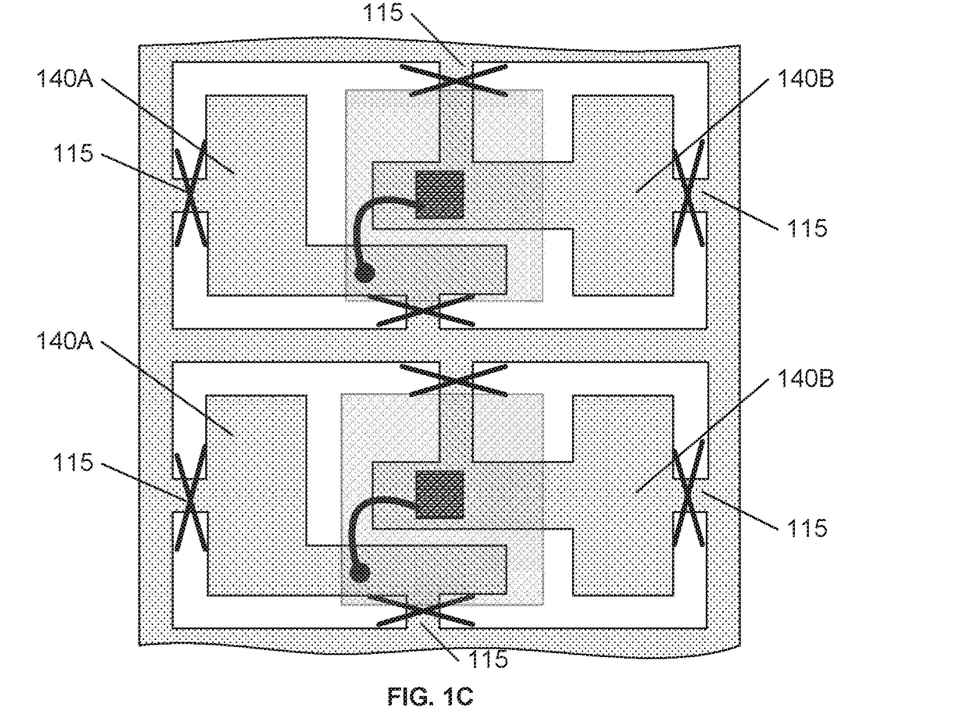

Structure 160 is formed around the light emitting element 150 so as to encompass a significant portion of the conductor elements 135. In this manner, the structure 160 provides structural support for the light emitting element 150 and the conductor elements 135. When structure 160 provides this mechanical support, the tie bars 115 may be severed, as illustrated by the "X" s in FIG. 1C.

Figure 1D:
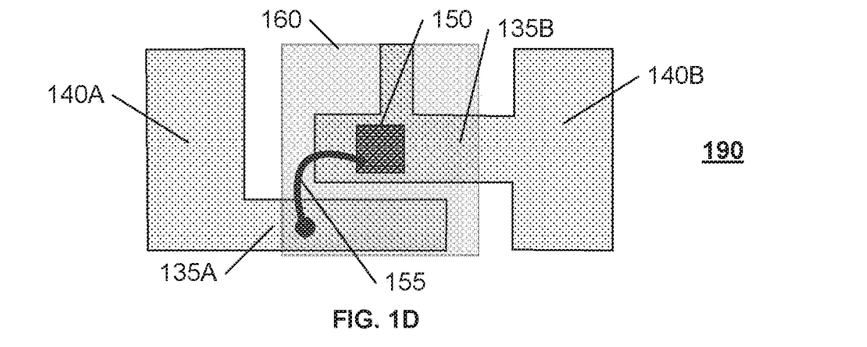

FIG. 1D illustrates a resultant 'singulated' light emitting device 190. This device 190 includes a light emitting element 150 encased in a protective structure 160. The light emitting element 150 is electrically coupled to pads 140A, 140B for providing external power to the light emitting element 150, via conductor elements 135A, 135B.

Figure 1E:
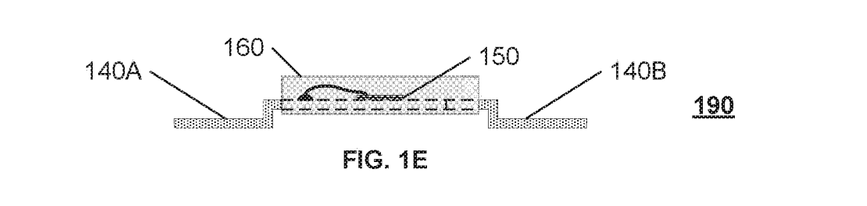

The metal elements that are external to the structure 160 may subsequently be formed to a desired shape. FIG. 1E illustrates a profile view of the light emitting device 190 after funning a 'step' in the conductor elements 135 so that the pads 140A, 140B extend lower than the lower surface of the structure 160.

The light emitting element 150 will generate heat during operation. At low power, a sufficient amount of this heat may be dissipated through the structure 160 and the pad 140B (minimal heat is transferred to pad 140A via the bonding wire 155). At higher power, an external heat sink, or other heat dissipating mechanism, may be required to prevent thermal damage to the light emitting element 150. Such an external heat dissipating mechanism adds material cost to the finished product, requires an extra manufacturing step, further adding to the cost, and often requires modification to the basic structure of the light emitting device to accommodate this heat dissipating mechanism. For example, if a heat sink were to be installed beneath the structure 160 of the light emitting device 190, the extent of the conductors 135 may need to be increased, to increase the height of the structure 160 above the pads 140 in order to accommodate the height of the heat sink Additionally, depending upon the thickness of the structure 160 beneath the conductor 135B, the thermal transfer from the light emitting element 150 to the heat sink beneath the structure 160 may be inefficient.

SUMMARY OF THE INVENTION

It would be advantageous to reduce or eliminate the need to provide an external heat dissipating mechanism for light emitting devices. It would also be advantageous to provide a design architecture that accommodates the fabrication of light emitting devices having different heat dissipation requirements.

To better address one or more of these concerns, in an embodiment of this invention, a heat dissipation element is designed to be integral to the light emitting device. This heat dissipation element is included in the leadframe that is used to facilitate fabrication of the light emitting device, to provide a single common substrate that forms both the heat dissipation element and the conductive elements for coupling the light emitting device to external sources of power. In an example embodiment, the size of the heat dissipating element is sufficient to maintain the light emitting device at a non-damaging temperature during operation at nominal operating conditions.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Of particular note, the figures are provided to facilitate an understanding of the invention. The illustrated shapes and dimensions are not intended to define or otherwise limit the shape or dimensions that one may use to embody this invention, except as otherwise explicitly stated in the claims.

Figure 2A:
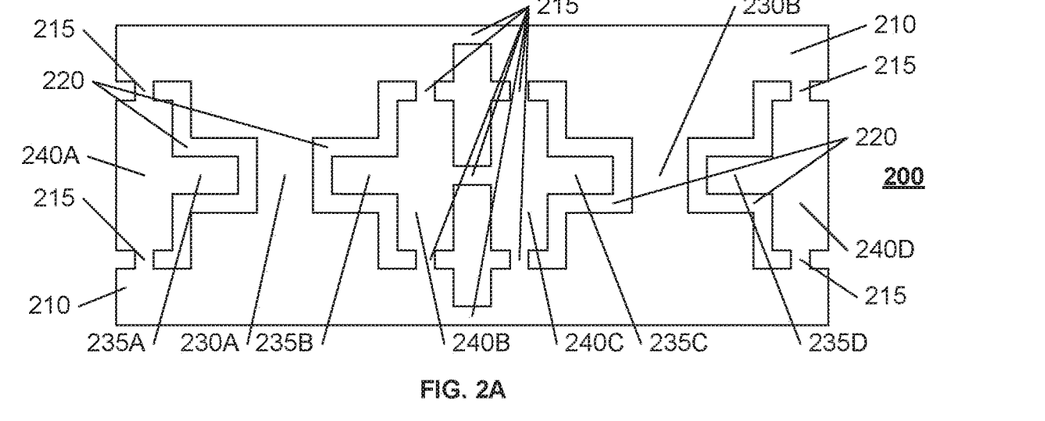
FIGS. 2A-2D illustrate an example manufacture of light emitting devices with integral heat dissipation elements that are included in a leadframe.

FIG. 2A illustrates an example leadframe 200 that includes an integral heat dissipation element 210. As in the example of FIG. 1A, the leadframe 200 also includes openings 220 that serve to form pads 240A, 240B, 240C, 240D (collectively "240") and conductor elements 235A, 235B, 235C, 235D (collectively "235") for coupling these pads 240 to light emitting elements that will be situated at sites 230A, 230B (collectively "230") on the heat dissipating element 210. The illustrated section of the leadframe comprises a pattern for producing two light emitting devices, each to be situated at site 230A, 230B on the heat dissipating element 210.

The leadframe 200 also includes tiebars 215 that serve to (temporarily) attach the conductor elements 235 and pads 240 to the leadframe. Even though these tiebars 215 couple the conductors 235 and pads 240 to the heatsink 210, the conductors 235 and pads 240 do not form part of the heatsink 210, because upon removal of the tiebars 215, the conductors 235 and pads 240 will be isolated from the heatsink 210. (That is, the heatsink 210 includes the continuous area hounded by the tiebars 215.)

The heatsink 210 may be any of a variety of materials that provide efficient thermal transfer and dissipation. In an example embodiment, the leadframe 200 is a sheet of copper, between 0.1 mm and 0.4 mm thick. A thicker sheet is preferred for thermal transfer, but is more costly than a thinner sheet, and creating the openings 220 may be more difficult and/or more costly.

Figure 2B:
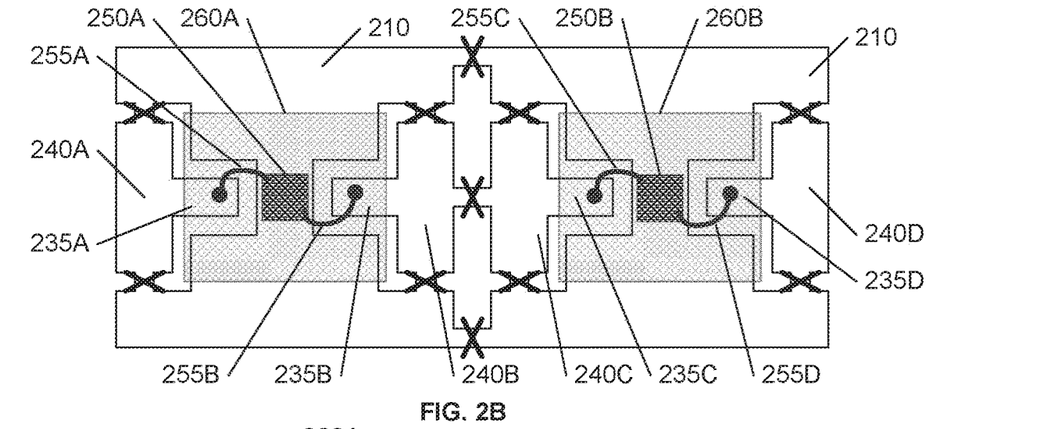

FIG. 2B illustrates the leadframe 200 after being populated with light emitting elements 250A, 250B and protective structures 260A, 260B. In this example, both contacts of the light emitting elements 250A, 250B are situated on the top surface of each light emitting element 250, and bonding wires 255A, 255B, 255C, 255D are used to couple the contacts of the light emitting elements 250A, 250B to the pads 240A, 240B, 240C, 240D.

The protective structures 260A, 260B encompasses portions of the heat dissipating element 210 and conductors 235, thereby fixing their position relative to each other, and providing structural support for the elements within the structures 260A, 260B. The structures 260A, 260B may be any of a number of forms. In an example embodiment, the structures 260A, 260B includes a transparent silicone material that is molded over the light emitting elements 250A, 250B on the heat dissipating element 210. In another embodiment, the silicone material m ay include a wavelength conversion material for producing a desired color of the emitted light. In another embodiment, as detailed further below, the structures 260A, 260B may be a reflective structure with an opening that accommodates the light emitting elements 250A, 250B. In some embodiments, the structures 260A, 260B may comprise a material that has a high thermal dissipation efficiency, to further enhance the heat dissipation characteristics of the light emitting device.

Once the structures 260A, 260B are formed, the tiebars 215 (FIG. 2A) may be removed, typically via a metal punch process. As noted above, the figures are provided to facilitate an understanding of the invention, and are not drawn to scale. The tiebars 215 may be substantially thinner than illustrated, to facilitate their removal by punching or other process intended to sever these tiebars 215.

Figure 2C:
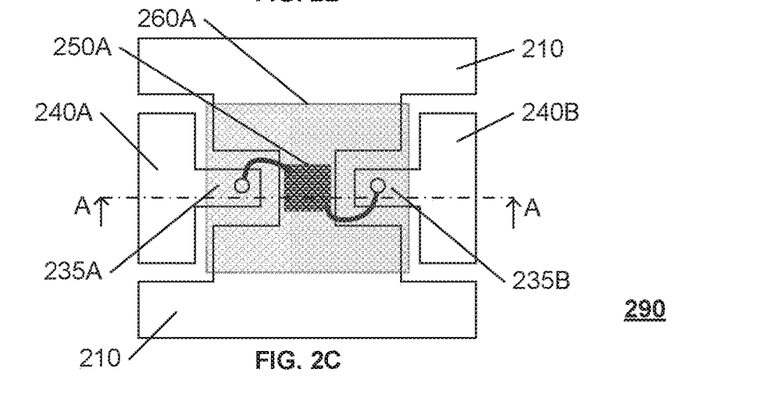
Figure 2D:
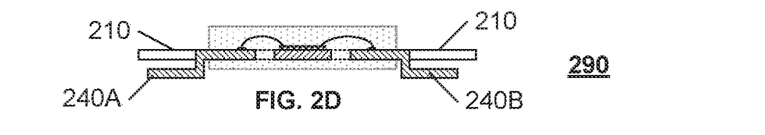

FIG. 2C illustrates a singulated light emitting device 290 after the tiebars 215 are removed, and FIG. 2D illustrates the device 290 after the conductive elements 235 are formed to place the pads 240 lower than the structure 260.

This device 290 offers substantial benefits with regard to heat dissipation efficiency. As noted above, the light emitting element 250 is mounted directly upon the heat dissipation element 210. A thermally efficient bonding material, such as silver filled epoxy, may be used to optimize the thermal transfer from the light emitting element 250A to the heat dissipation element 210. A portion of the heat dissipation element 210 in this example extends beyond the structure 260A, providing for an efficient transfer of heat to the surrounding medium, which may be air, water, or other medium.

The amount of heat dissipation provided by the heat dissipation element will be dependent upon the characteristics of the material used as the leadframe 200, as well as the surface area of the heat dissipation element 210. The size of the heat dissipation element 210 may vary, depending upon the amount of heat that the particular light emitting element 250A is expected to generate. In some embodiments, the heat dissipation requirement may be such that the heat dissipation element need not extend beyond the extent of the structure 260A; in other embodiments, the heat dissipation element may extend well beyond the extent of the structure 260A. In this manner, high power light emitting elements 250A may be accommodated using the same structure 260A, conductors 235A, 235B, and pads 240A, 240B by merely increasing the size of the heat dissipation element 210.

Of particular note, because the extent of the heat dissipation element 210 in one dimension is perpendicular to the lateral extent of the conductor elements 235A, 235B, the extent of the heat dissipation element 210 may be increased or decreased without requiring a modification to the architecture of the conductive elements 235A, 235B relative to the site of the light emitting element 250.

In an example embodiment, the area encompassed by the heat dissipation element 210 is at least 50%, of the total area encompassed by the finished device 290; preferably the area of the heat dissipation element is at least 65% of the total area; and more preferably, the area of the heat dissipation element is at least 85% of the total area.

In an example embodiment, the size of the heat dissipating element is sufficient to maintain the light emitting element 250A at a non-damaging temperature during operation at nominal operating conditions. For example, in a lighting application, the size of the heat dissipating element 210 is sufficient to maintain the temperature of the light emitting element below 85° C. at 0.5 watt. In some embodiments, additional heat dissipation may be achieved by appropriately shaping the heat dissipation element 210 after the structure 260A is formed, and/or by coupling the heat dissipation element 210 to external heat dissipation elements, such as a set of heat dissipating fins, to provide additional heat dissipating surface area. As noted above, the heat dissipation characteristics may be enhanced by using a material with high thermal dissipation efficiency to form the structure 260A. In such an embodiment, the size of the heat dissipating element may be reduced accordingly to maintain the light emitting element 250A within this structure 260A at a non-damaging temperature.

Figure 3A:
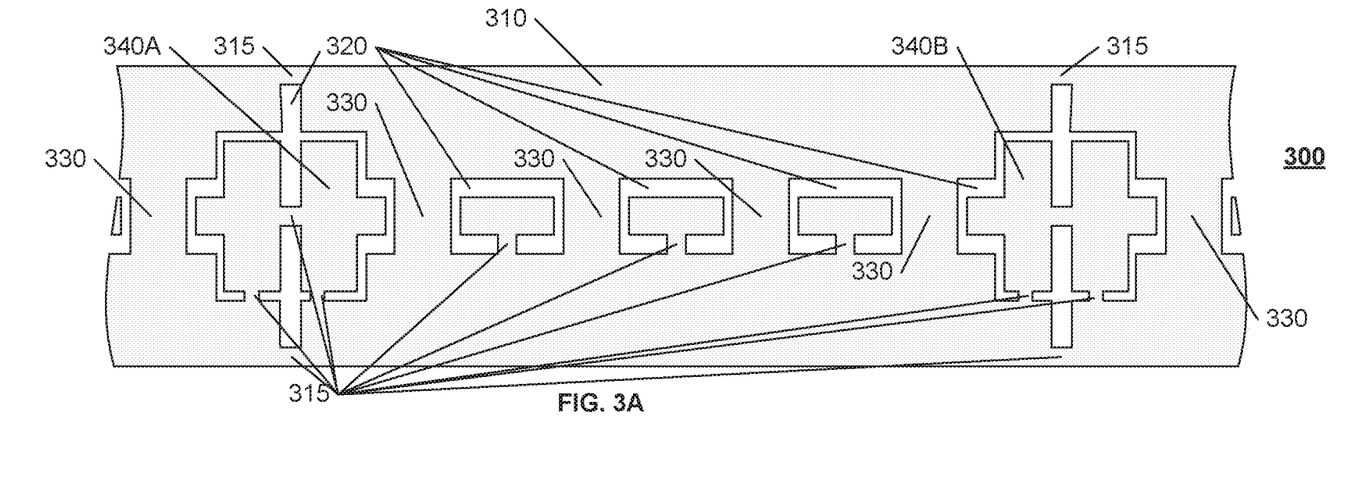
FIGS. 3A-3E illustrate an example manufacture of light emitting structure that includes multiple light emitting devices and a common heat dissipating element.

FIG. 3A illustrates a leadframe 300 for producing a light emitting structure that will include four light emitting elements, each situated at a site 330 on a heat dissipating element 310. In this embodiment, a single heat dissipating element 310 is common to all of the light emitting elements.

As illustrated, the leadframe 300 includes openings 320 that serve to create different segments of the leadframe 300, including the creation of the heat dissipating element 310 as defined by the continuous area between tiebars 315. The openings 320 also create conductor elements 325 (illustrated in FIG. 3B) that are separated from the heat dissipation element 310 by the tiebars 315.

Figure 3B:
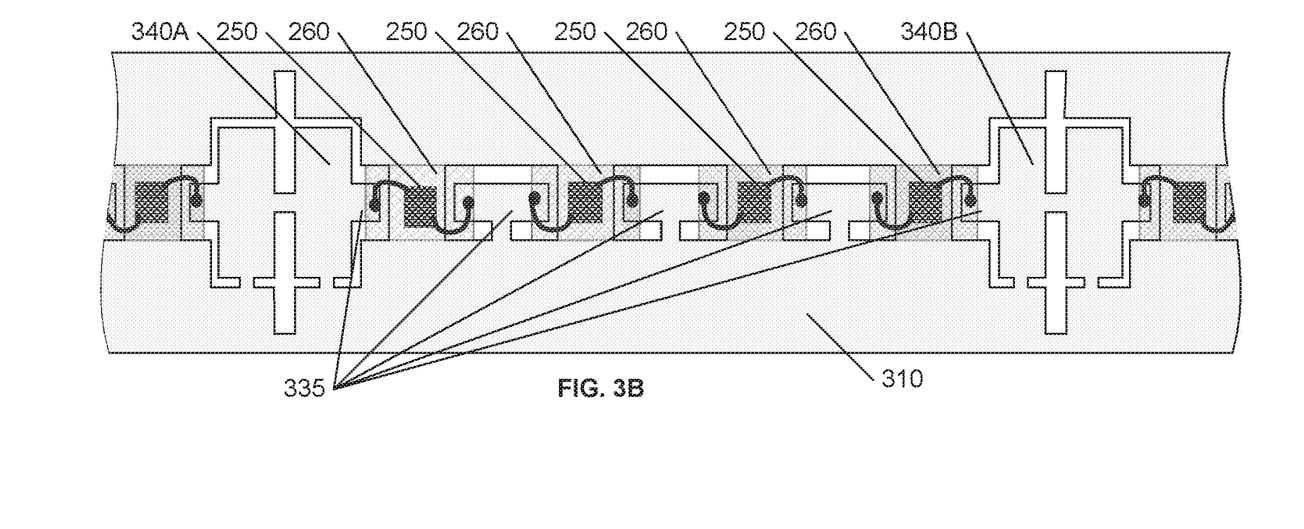

FIG. 3B illustrates the leadframe 300 after being populated by light emitting elements 250 and structures 260. In this embodiment, the four light emitting elements 250 are connected in series between pads 340A and 340B, via the conductive elements 325.

Figure 3C:
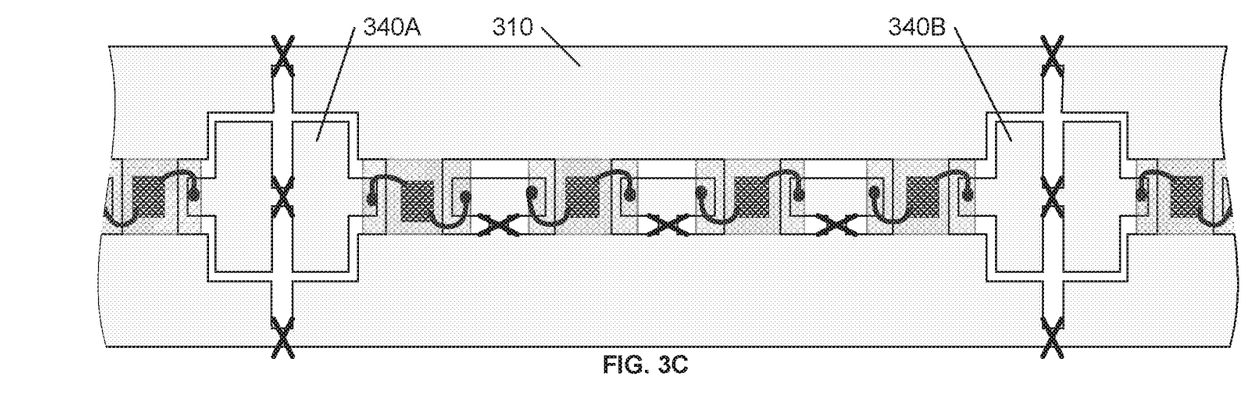
Figure 3D:
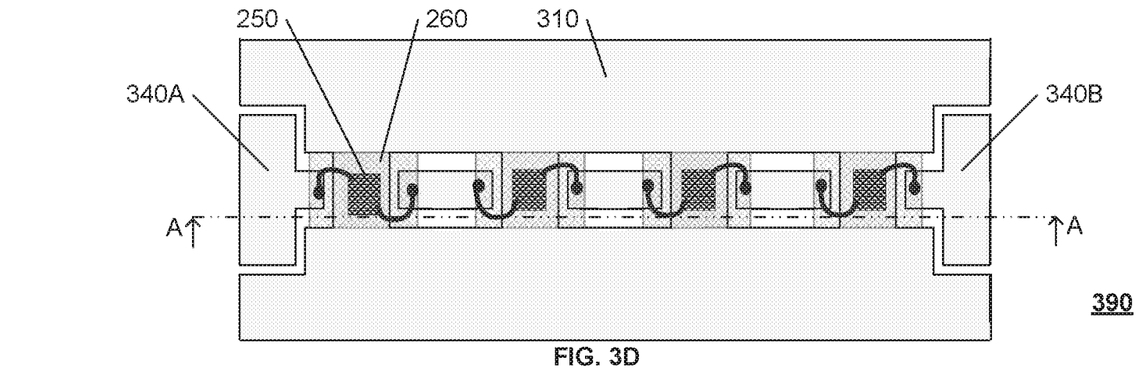
Figure 3E:
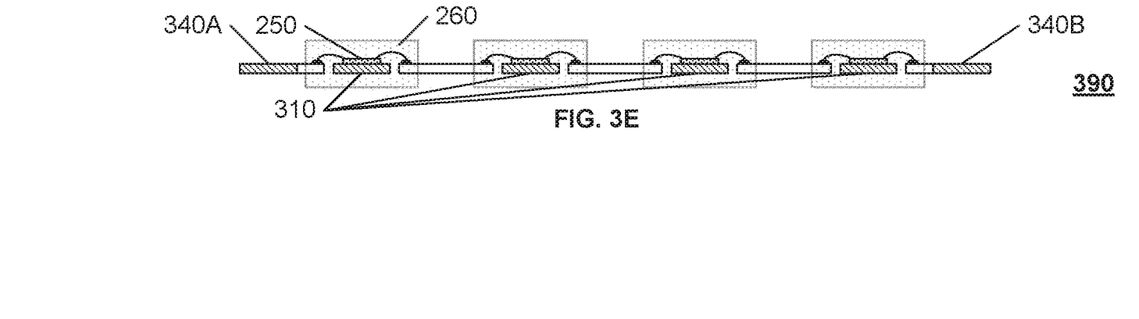

FIG. 3C illustrates the removal of the tiebars 315 (illustrated in FIG. 3A), as indicated by the "X"s that sever these tiebars, to provide a singulated light emitting structure 390 as illustrated in FIGS. 3D and 3E. The leads to the pads 340A, 340B may subsequently be formed to provide a desired profile.

Although the light emitting structure 390 is illustrated as having four distinct protective structures 260, one of skill in the art will recognize that a single protective structure could extend across all four of the light emitting elements 250.

As with the structure 290, the heat dissipating element 310 of light emitting structure 290 may be sized to provide sufficient heat dissipation for the particular light emitting elements 250 within the light emitting structure 390.

The embodiment of a light emitting structure that includes multiple light emitting devices with integral heat dissipation element(s) offers potential for creating structures that provide a desired light output pattern.

Figure 4A:
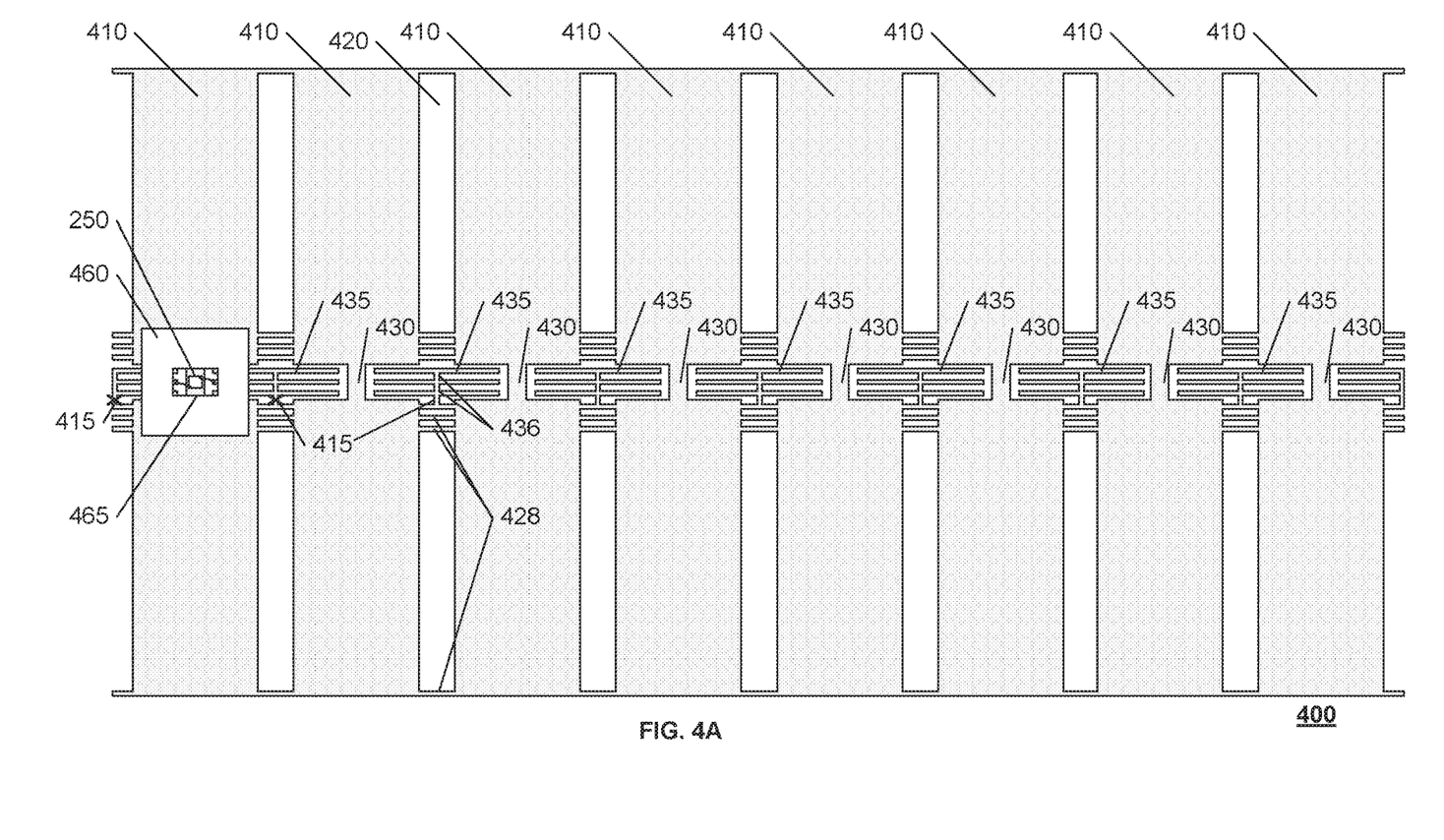
FIG. 4A illustrates an example leadframe for manufacturing a light emitting structure that includes multiple light emitting devices and heat dissipating elements.

FIG. 4A illustrates a leadframe 400 that provides a light emitting structure that includes eight light emitting elements, each with an integral heat dissipation element 410. The light emitting structure is intended to be formed so as to emit light in all radial directions of a circle, as illustrated in FIG. 4E.

The leadframe 400 includes heat dissipation elements 410 and conductor elements 435 that extend between sites 430 upon which the light emitting elements will be situated. Tiebars 415 enable the conductor elements 435 to be separated from the heat dissipation element 410. Of particular note, the conductor elements 435 include three conductors that are coupled by elements 426. The use of three thin conductors to form conductor element 435 facilitate the bending of the structure at the regions 420 between the heat dissipation elements 410, as illustrated in FIG. 4E.

The heat dissipation elements 410 are coupled to each other for structural stability, also using thin elements 428 in the region 420. The use of thin elements 428 also facilitates the aforementioned bending of the structure at the regions 420 between the heat dissipation elements 410.

The use of multiple thin elements in the conductor element 435 also facilitate the forming of alternative circuit configurations. For example, the coupling 436 between the multiple elements forming the conductor element 435 may be severed to provide multiple conductor paths between and among the light emitting elements 250. Such paths may allow for a parallel arrangement of the light emitting elements 250, or for a structure that couples the elements in a selective manner depending upon a desired output luminance level, or a desired output pattern.

Figure 4B:
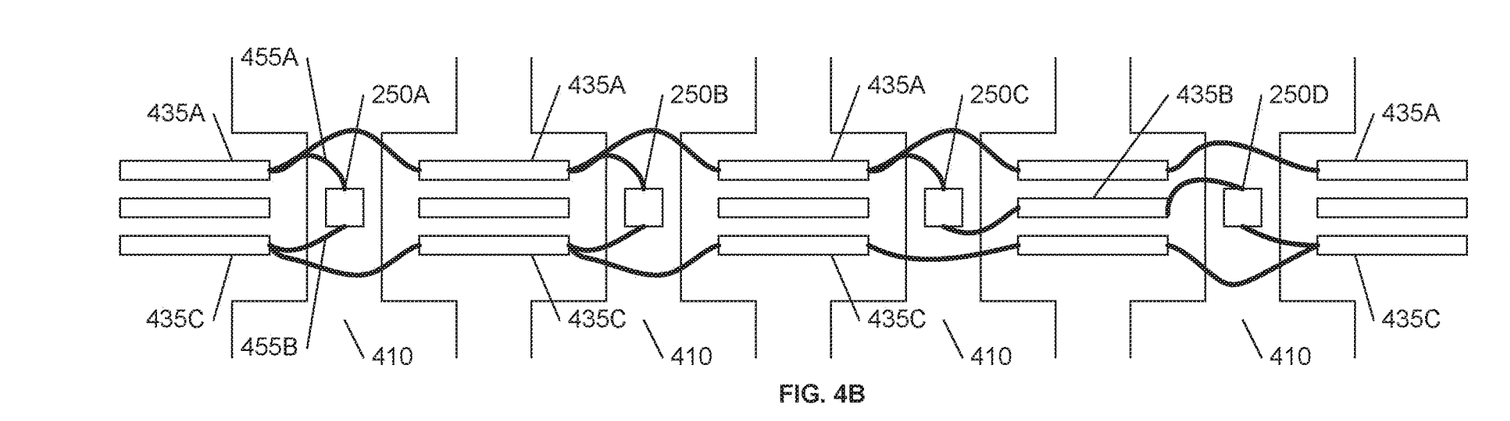
FIGS. 4B and 4C illustrate an example parallel-series arrangement of light emitting elements.

For example, if the coupling 436 between the conductors of conductor element 435 were severed between each of the light emitting elements, as illustrated in FIG. 4B, the upper separated conductor elements 435A could be coupled to a positive voltage, while the lower separated conductor elements 435C could be coupled to a negative voltage, or ground. In this example, the bonding wire 455A that attach to the contacts of the light emitting elements 250A would be 'stitched' to couple the "p-contact" to the upper conductor element 435A to the left and right of the light emitting element 250A, and the bonding wire 455B would couple the "n-contact" to the lower conductor element 435C to the left and right of the light emitting element 250. Light emitting element 250B would be similarly connected to 435A and 435C. In this manner, the light emitting elements 250A, 250B would be connected in parallel.

Figure 4C:
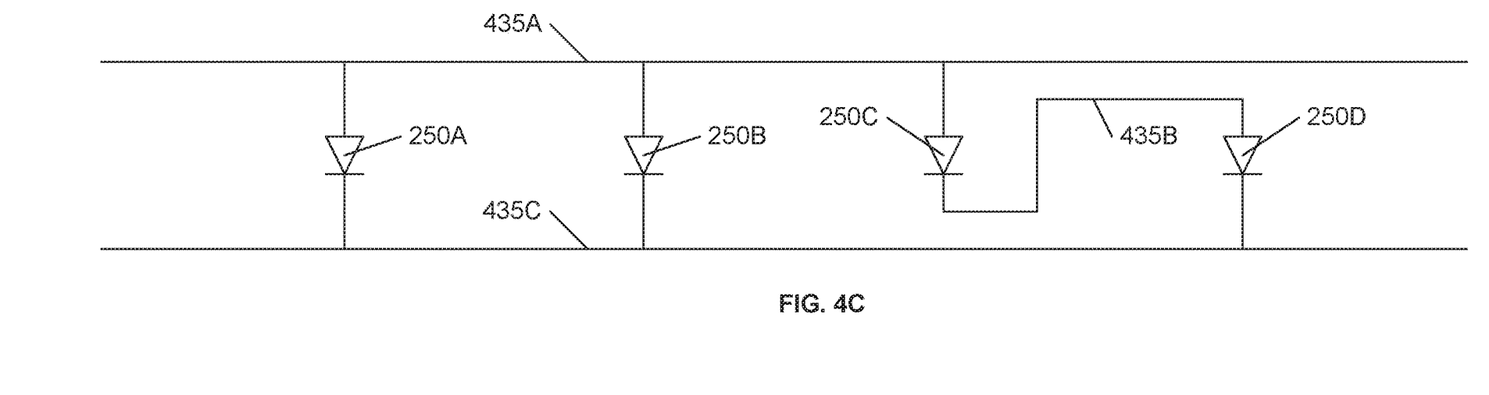

The center conductor element 435B could be used to selectively arrange a series arrangement of light emitting elements 250C, 250D to be placed in parallel with the parallel arrangement of light emitting elements 250A and 250B. The corresponding circuit diagram is illustrated in FIG. 4C One of skill in the art will recognize that any of a variety of circuits may be created in this manner. If the conductor element 435 included more than three thin conductive elements, the variety and potential complexity of circuit arrangements would be even greater.

In these examples, the coupling 436 of FIG. 4A will serve as a tie-bar to hold the individual conductor elements 435A, 435B, 435C in place until the protective structures 460 are formed, then severed.

In this illustration only one protective structure 460 and light emitting element 250 are illustrated, for ease of illustration and understanding. This illustration is approximately to scale, so that the relative sizes of the elements may be appreciated. In this example, the width of each heat dissipation dement 410 is approximately 7 mm, the space 420 is approximately 2 mm, the protective structure 460 is approximately 6 mm×6 mm, the opening 465 is approximately 1.5 mm×2.5 mm, and the light emitting element is approximately 1 mm×1 mm. In this example embodiment, the heat dissipation element 410 comprises about 75% of the total area encompassed by the light emitting structure of 490 illustrated in FIGS. 4D-4E.

The protective structure 460 may be a reflective enclosure that surrounds the light emitting element 250. The structure 460 may be formed on the leadframe 400 before the light emitting element 250 is bonded to the heat dissipating element 410, to avoid subjecting the light emitting element 250 to the process used to form the structure 460. In this example, the structure 460 includes an opening 465 that is sufficient to enable the placement and bonding of the light emitting element 250 to the heat dissipation element 410, and the wirebonding of the light emitting element 250 to the conductor elements 435. An encapsulant (not illustrated) may be used to fill the opening 465 in the structure 460, and this encapsulant may include a wavelength conversion material. In an example embodiment the protective structure 460 may comprise a material with high emissivity.

In this embodiment, connection of the light emitting dements 250 to an external source of power may be effected by coupling to the exposed conductor elements 435 at each end of the arrangement of light emitting elements 250.

Figure 4D:
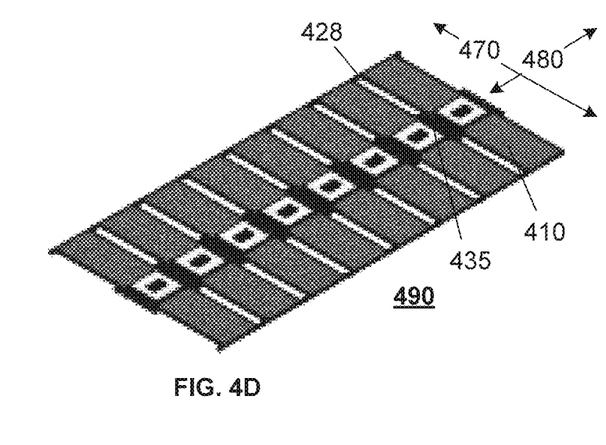
FIGS. 4D and 4E illustrate forming an arrangement of multiple light emitting devices to provide a desired light output pattern.
Figure 4E:
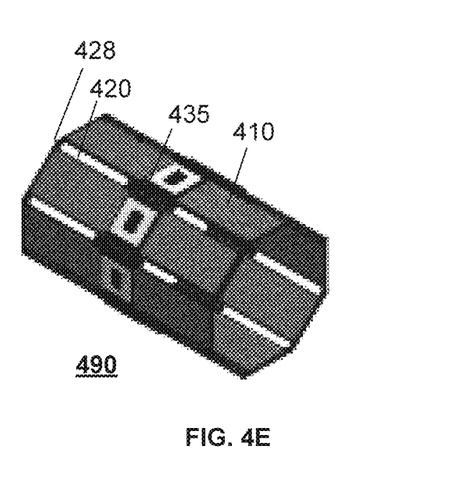

FIG. 4D illustrates a fully populated light emitting structure 490 comprising eight light emitting elements 250, supporting structures 430, conductive elements 435, and individual heat dissipation elements/panels 410. It is significant to note that the heat dissipation panels 410 extend along a first axis 470 relative to the supporting structures 430, and the conductor elements 435 extend along a second axis 480 that is substantially orthogonal to the first axis 470. In this manner, the heat dissipation panels 410 can be extended or contracted, depending upon the heat dissipation requirements, while maintaining the same arrangement of conductor elements 435, and vice versa.

FIG. 4E illustrates the structure 490 formed in a somewhat circular form to provide light emission in ail radial directions relative to a circle centered on the structure 490. In this embodiment, the eight heat dissipating panels 410 are coupled together via the thin elements 428 and 435 that are bent to form the eight panels 410 into an 8-sided shape, with each of the light emitting elements 250 illuminating an arc of at least 45°, thereby providing a illumination arc of 360° (8*45). One of skill in the art will recognize that fewer, or more panels 410 may be included, depending upon the desired uniformity of the light over the illumination arc, with additional panels 410 serving to enhance the uniformity.

Figure 5:
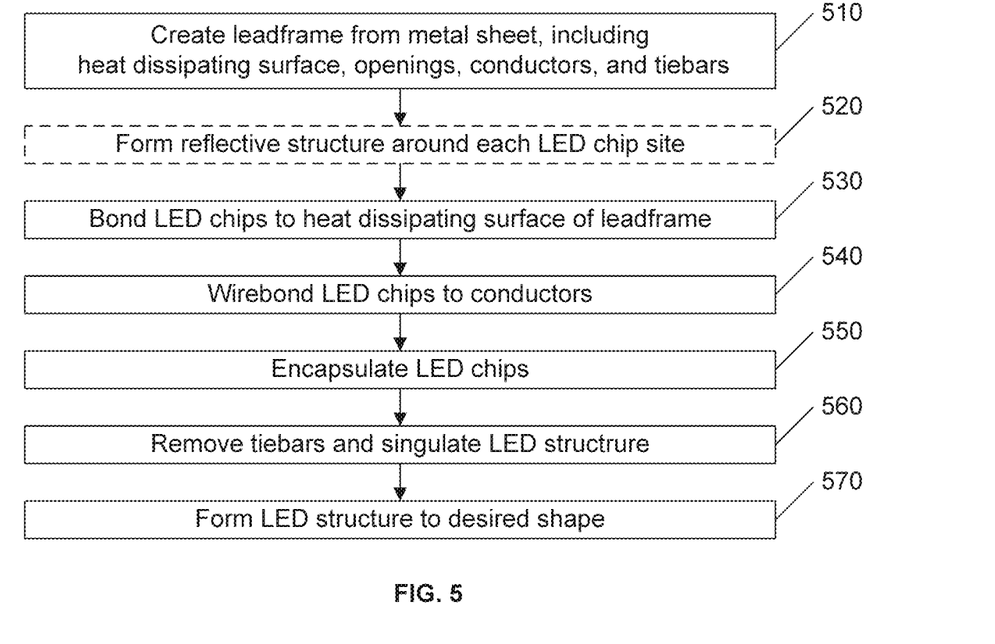
FIG. 5 illustrates an example flow diagram for manufacturing light emitting structures with integral heat dissipation elements.

FIG. 5 illustrates an example flow diagram tor manufacturing light emitting structures with integral heat dissipation elements.

At 510, the leadframe is formed by creating openings in a metal substrate, such as a copper strip or plate, to form heat dissipation elements with sites for mounting light emitting elements and conductive elements for coupling the light emitting elements to external power sources. The conductive elements may be coupled to the heat dissipation elements via removable tiebars.

Optionally, at 520, reflective structures may be formed around the sites of the light emitting elements, with an opening that permits the placement of the light emitting element at the site and the coupling of the light emitting elements to the conductive elements.

At 530, the light emitting elements are bonded to the heat dissipating element, preferably using a bonding material having high thermal transfer efficiency.

At 540, the contacts of the light emitting elements are coupled to the conductive elements. Wire bonding may be used to provide this coupling.

At 550, the light emitting element is encapsulated with a transparent protective material, such as silicone. The protective material may include wavelength conversion material, such as a phosphor that absorbs some or all of the light of the wavelength emitted by the light emitting element and emits light at a different wavelength.

At 560, the tiebars that coupled the conductive elements to the heat dissipation element are removed, as are the tiebars that coupled each of the individual structures, thereby singulating the individual light emitting structures, as in the example of FIG. 2D, or singulating groups of light emitting structures, as in the example of FIGS. 3D and 4D.

At 570, the portion of the leadframe that is external to the protective structure(s) surrounding the light emitting element(s) may be formed into a desired shape that facilitates the use of the light emitting structure in a higher assembly.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein, in a multiple light emitting device structure comprising different types of light emitting elements, each of the heat dissipation elements may differ in size, depending upon the heat generated by the particular type of device situated on each heat dissipation element, to maintain a relatively uniform temperature among all of the different types of light emitting elements.

Additionally, in the example embodiments, the heat dissipation element is isolated from each of the contacts of the light emitting elements. One of skill in the art will recognize, however, that the heat dissipation element may form one of the pads that couple the external source to the light emitting element. That is, for example, one of the contacts of the light emitting element 250 of FIGS. 2B-2D may be electrically coupled to the heat dissipation element 210, and a separate pad 240B need not be formed, the external coupling to the light emitting element 250 being provided by pad 240A and the heat dissipation element 210.

In like manner, although the figures use a single square (die) to illustrate each light emitting element 250, one of skill in the art will recognize that each light emitting element 250 may include multiple chips, for increased illumination, multiple wavelength illumination, and so on. In like manner, the light emitting elements 250 and/or the protective elements 240 may include wavelength transforming material, such as a phosphor Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A device comprising:
   a conductive substrate defining one or more openings, the openings separating a heat dissipation region of the conductive substrate and a conductor region of the conductive substrate;
   a light emitting element disposed on the heat dissipation region of the substrate and electrically connected to the conductor region of the substrate; and
   a protective structure disposed on a portion of the heat dissipation region and a portion of the conductor region, and disposed over a portion of the openings between the portion of the heat dissipation region and the portion of the conductor region, to physically connect the heat dissipation region and the conductor region.

2. The device of claim 1, wherein the conductive substrate comprises a first edge and a second edge, and the conductor region comprises a first pad region at the first edge, the first pad region separated from the heat dissipation region by a first portion of the opening, and a second pad region at the second edge, the second pad region separated from the heat dissipation region by a second portion of the opening.

3. The device of claim 2, further comprising a first bonding wire electrically connecting the light emitting element to the first pad region, and a second bonding wire electrically connecting the light emitting element to the second pad region.

4. The device of claim 1, wherein the conductor region is bent away from the heat dissipation region.

5. The device of claim 1, wherein the conductive substrate is a metallic sheet.

6. The device of claim 1, wherein the conductive substrate is a copper sheet.

7. The device of claim 1, wherein the protective structure comprises a transparent silicone material molded over the light emitting element.

8. A device comprising:
   a conductive substrate defining a plurality of openings, the openings separating a heat dissipation region of the conductive substrate and a conductor region of the conductive substrate, the conductor region comprising a plurality of conductor segments each surrounded by one of the openings and the heat dissipation region;
   a plurality of light emitting elements each disposed on portions of the heat dissipation region of the conductive substrate between the conductor segments, and electrically connected to the conductor segments; and
   a protective structure disposed on a portion of the heat dissipation region and a portion of the conductor region, and disposed over a portion of the openings between the portion of the heat dissipation region and the portion of the conductor region, to physically connect the heat dissipation region and the conductor region.

9. The device of claim 8, further comprising bonding wires electrically connecting the light emitting elements to the conductor segments, the light emitting elements electrically connected in series.

10. The device of claim 8, wherein the conductor segments comprise an upper conductor element and a lower conductor element, the upper and lower conductor elements within each conductive segment are electrically isolated from each other, and the light emitting elements are electrically connected in parallel through upper and lower conductor elements of adjacent conductive segments.

11. The device of claim 8, wherein the conductor segments comprise an upper conductor element, a central conductor element, and a lower conductor element, each of the upper, central and lower conductor elements of a conductive segment are electrically isolated from each other.

12. The device of claim 11, wherein at least a portion of the light emitting elements are electrically connected in parallel.

13. The device of claim 11, wherein at least a first portion of the light emitting elements are electrically connected in series and a second portion of the light emitting elements are electrically connected in parallel.

14. The device of claim 8, wherein the protective structure extends over two or more of the light emitting elements.

15. The device of claim 8, wherein the protective structure comprises a plurality of reflective enclosures that surround individual light emitting elements.

16. The device of claim 8, wherein the conductive substrate comprises a bend along a line that extends through the heat dissipation element and one of the conductive segments, and light emitting elements on opposite sides of the bend face different directions.

17. The device of claim 8, wherein the conductive substrate comprises two or more bends, each bend extending from an upper edge of the heat dissipation region, through one of the conductor segments, and to a lower edge of the heat dissipation region opposite the upper edge.

18. The device of claim 17, wherein the light emitting elements are configured such that the device emits light in all radial directions.

19. The device of claim 8, wherein the conductive substrate further comprises a first edge and a second edge, and the conductor region further comprises a first pad region at the first edge separated from the heat dissipation region by a first portion of the opening, and a second pad region at the second edge separated from the heat dissipation region by a second portion of the opening.

20. The device of claim 8, wherein the conductive substrate further comprises a first edge and a second edge opposite the first edge, and the heat dissipation region defines slits extending from a position on the heat dissipation region adjacent one of the conductor segments toward the first edge, and from another position on the heat dissipation region adjacent an opposite side of the one of the conductor segments toward the second edge.

* * * * *